United States Patent
Ng

(10) Patent No.: US 7,717,481 B2
(45) Date of Patent: May 18, 2010

(54) HIGH TEMPERATURE ROBOT END EFFECTOR

(75) Inventor: Eric Ng, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/968,441

(22) Filed: Jan. 2, 2008

(65) Prior Publication Data
US 2008/0170929 A1 Jul. 17, 2008

Related U.S. Application Data

(63) Continuation of application No. 60/884,542, filed on Jan. 11, 2007.

(51) Int. Cl.
*B65G 49/07* (2006.01)
(52) U.S. Cl. .......................... 294/1.1; 414/935; 414/941
(58) Field of Classification Search .................. 294/1.1, 294/64.1, 902; 414/935, 941
See application file for complete search history.

(56) References Cited

U.S. PATENT DOCUMENTS

| 5,483,138 | A | 1/1996 | Shmookler et al. | |
|---|---|---|---|---|
| 6,244,641 | B1 * | 6/2001 | Szapucki et al. | 294/64.1 |
| 6,260,894 | B1 * | 7/2001 | Minnick et al. | 294/1.1 |
| 6,267,423 | B1 * | 7/2001 | Marohl et al. | 294/1.1 |
| 6,312,534 | B1 | 11/2001 | Grensing | |
| 6,688,662 | B2 * | 2/2004 | Casarotti et al. | 294/64.3 |
| 6,776,846 | B2 * | 8/2004 | Maher et al. | 118/719 |
| 2003/0012631 | A1 | 1/2003 | Pencis et al. | |
| 2004/0048474 | A1 * | 3/2004 | Asano | 438/689 |
| 2006/0113806 | A1 * | 6/2006 | Tsuji et al. | 294/1.1 |

FOREIGN PATENT DOCUMENTS

EP 0878267 11/1998

OTHER PUBLICATIONS

Official Letter dated Jul. 3, 2009, from the Chinese Patent Office for corresponding Chinese Patent application No. 200810000752.2.

* cited by examiner

*Primary Examiner*—Dean J Kramer
(74) *Attorney, Agent, or Firm*—Patterson & Sheridan, LLP

(57) ABSTRACT

A robotic end effector or blade suitable for transferring a substrate in a processing system is provided. In some embodiments, an end effector can include a body having opposing mounting and distal end, the body fabricated from a single mass of ceramic. The body can include a pair of arcuate lips extending upward from an upper surface of the body. Each lip is disposed on a respective finger disposed at the distal end of the body. An arcuate inner wall extends upward from the upper surface at the mounting end of the body. The inner wall and lips define a substrate receiving pocket. A plurality of contact pads extend upward from the upper surface of the body for supporting the substrate thereon. A recess is formed in a bottom surface of the body to accommodate a mounting clamp.

12 Claims, 4 Drawing Sheets

HIGH TEMPERATURE ROBOT END EFFECTOR

CROSS-REFERENCE TO RELATED APPLICATION

This application claims benefit to U.S. Provisional Patent Application No. 60/884,542, filed Jan. 11, 2007 (APPM/11788L), which is incorporated by reference in its entirety.

BACKGROUND OF THE INVENTION

1. Field of the Invention

The embodiments of the invention generally relate to robot components utilized in high temperature semiconductor processing systems.

2. Background of the Related Art

Semiconductor substrate processing is typically performed by subjecting a substrate to a plurality of sequential processes to create devices, conductors and insulators on the substrate. These processes are generally performed in a process chamber configured to perform a single step of the production process. In order to efficiently complete the entire sequence of processing steps, a number of process chambers are typically coupled to a central transfer chamber that houses a robot to facilitate transfer of the substrate between the surrounding process chambers. A semiconductor processing platform having this configuration is generally known as a cluster tool, examples of which are the families of PRODUCER®, CENTURA® and ENDURA® processing platforms available from Applied Materials, Inc., of Santa Clara, Calif.

Generally, a cluster tool consists of a central transfer chamber having a robot disposed therein. The transfer chamber is generally surrounded by one or more process chambers. The process chambers are generally utilized to process the substrate, for example, performing various processing steps such as etching, physical vapor deposition, ion implantation, lithography and the like. The transfer chamber is sometimes coupled to a factory interface that houses a plurality of removable substrate storage cassettes, each of which houses a plurality of substrates. To facilitate transfer between a vacuum environment of the transfer chamber and a generally ambient environment of the factory interface, a load lock chamber is disposed between the transfer chamber and the factory interface.

As line width and feature sizes of devices formed on the substrate have decreased, the positional accuracy of the substrate in the various chambers surrounding the transfer chamber has become paramount to ensure repetitive device fabrication with low defect rates. Moreover, with the increased amount of devices formed on substrates both due to increased device density and larger substrate diameters, the value of each substrate has greatly increased. Accordingly, damage to the substrate or yield loss due to non-conformity because of substrate misalignment is highly undesirable.

A number of strategies have been employed in order to increase the positional accuracy of substrates throughout the processing system. For example, the interfaces are often equipped with sensors that detect substrate misalignment within the substrate storage cassette. See U.S. patent application Ser. No. 6,413,356 issued Jul. 2, 2002 to Chokshi, et al. Positional calibration of robots has become more sophisticated. See U.S. patent application Ser. No. 6,648,730 issued Nov. 18, 2003 to Chokshi, et al. Additionally, methods have been devised to compensate for substrate misplacement on the blade of the robot. See U.S. Pat. No. 5,980,194, issued Nov. 9, 1499 to Freerks, et al., and U.S. Pat. No. 4,944,650, issued Jul. 31, 1490 to T. Matsumoto. Further methods have been devised to compensate for thermal expansion of the robot linkages. See U.S. Pat. No. 7,039,501, issued May 2, 2006 to Freeman, et al.

However, these strategies for increasing the accuracy of the robot generally do not compensate for thermal expansion for expansion and contraction experienced by the end effector (e.g., blade) robot as heat is transferred to the end effector from hot wafers and from hot surfaces within the process chambers. As evolving process technology has led to higher operating temperatures for many processes, transfer robots are increasingly exposed to high temperatures. Due to the increased thermal exposure of transfer robots, further strategies must be developed to minimize the adverse effect of robotic thermal expansion on substrate placement and undesired thermal exchange between the robot and substrate.

Therefore, there is a need for an improved robotic end effector having low thermal expansion to minimize thermal effects on robot positioning while minimizing thermal exchange between the robot and substrate carried thereon.

SUMMARY OF THE INVENTION

A robotic end effector or blade suitable for transferring a substrate in a processing system is provided. In one embodiment, an end effector can include a body having opposing mounting and distal ends. The body may be fabricated from a single mass of ceramic. The body can include a pair of arcuate lips extending upward from an upper surface of the body. Each lip is disposed on a respective finger disposed at the distal end of the body. An arcuate inner wall extends upward from the upper surface at the mounting end of the body. The inner wall and lips define a substrate receiving pocket. A plurality of contact pads extend upward from the upper surface of the body for supporting the substrate thereon. The contact pads and body being part of the same mass or ceramic. A recess is formed in a bottom surface of the body to accommodate a mounting clamp.

In other embodiments, the body can further include a plurality of holes formed through the body outward of the inner wall, wherein one end of the holes is open to the recess.

In other embodiments, the body can further include a hole formed through a centerline of the body, wherein the inner wall and lips are disposed at the same radial distance from a center of the hole.

In other embodiments, the body can weigh about 237 to about 703 grams. In yet other embodiments, the body is about 99.5 percent alumina by weight.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments. It is also contemplated that features of one embodiment may be beneficially utilized in other embodiments without further recitation.

DETAILED DESCRIPTION

Figure 1:
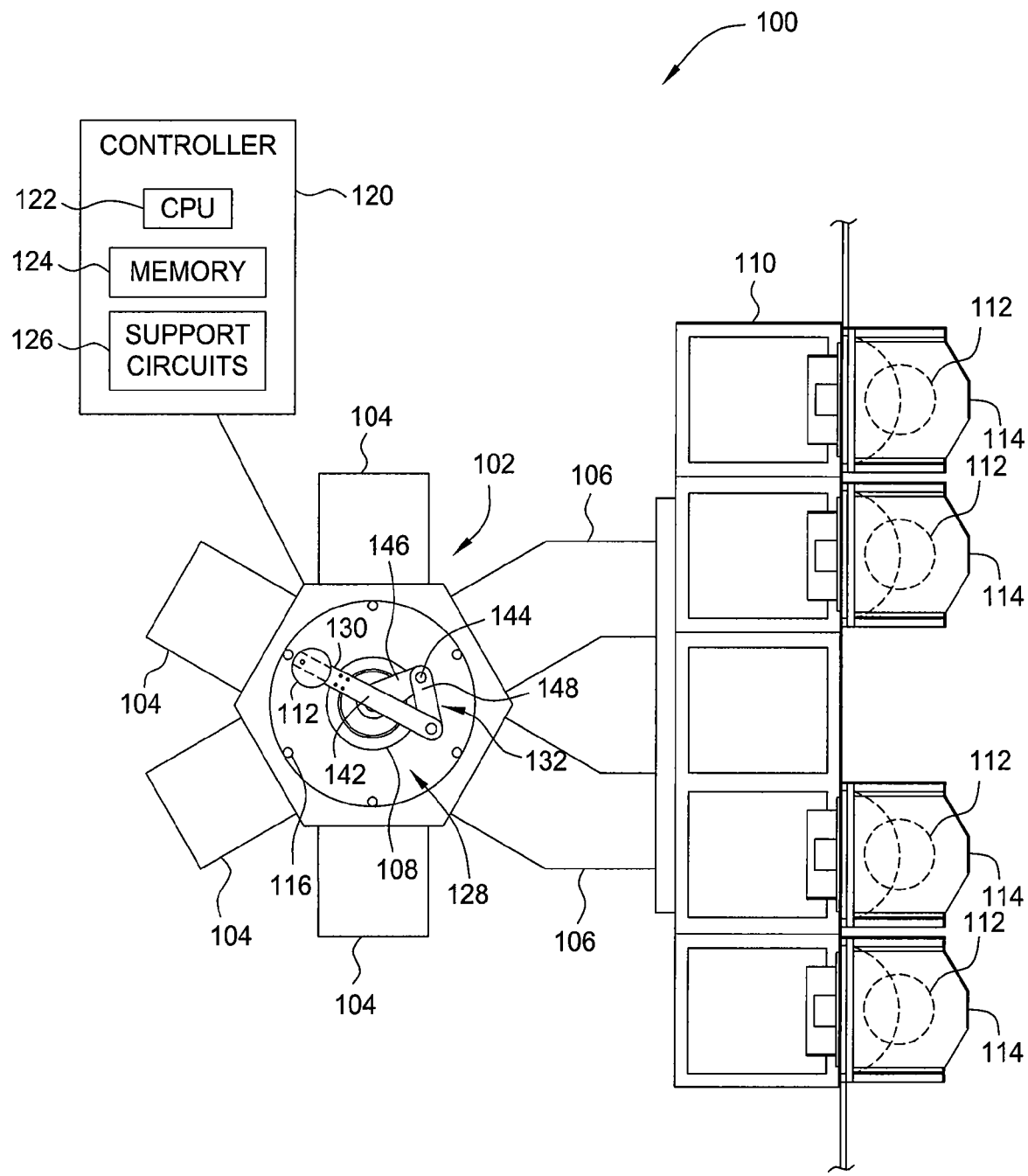
FIG. 1 is a plan view of one embodiment of a semiconductor processing system having an improved end effector suitable for use with high temperature processing environments.

FIG. 1 depicts one embodiment of a semiconductor processing system 100 having a robot 108 equipped with an end effector or blade 130. The exemplary processing system 100 generally includes a transfer chamber 102 circumscribed by one or more process chambers 104, a factory interface 110 and one or more load lock chambers 106. The load lock chambers 106 are generally disposed between the transfer chamber 102 and the factory interface 110 to facilitate substrate transfer between a vacuum environment maintained in the transfer chamber 102 and a substantially ambient environment maintained in the factory interface 110. One example of a processing system which may be adapted to benefit from the invention is a CENTURA® processing platform available from Applied Materials, Inc., of Santa Clara, Calif. It is contemplated that the blade 130 may be utilized on other robots and processing systems, including those available from other manufacturers.

The factory interface 110 generally houses one or more substrate storage cassettes 114. Each cassette 114 is configured to store a plurality of substrates therein. The factory interface 110 is generally maintained at or near atmospheric pressure. In one embodiment, filtered air is supplied to the factory interface 110 to minimize the concentration of particles within the factory interface and correspondingly substrate cleanliness. One example of a factory interface that may be adapted to benefit from the invention is described in U.S. patent application No. 6,719,516 issued Apr. 13, 2004 to Kroeker, which is hereby incorporated by reference in its entirety.

The transfer chamber 102 is generally fabricated from a single piece of material such as aluminum. The transfer chamber 102 defines an evacuable interior volume 128 through which substrates are transferred between the process chambers 104 coupled to the exterior of the transfer chamber 102. A pumping system (not shown) is coupled to the transfer chamber 102 through a port disposed on the chamber floor to maintain vacuum within the transfer chamber 102. In one embodiment, the pumping system includes a roughing pump coupled in tandem to a turbomolecular or a cryogenic pump.

The process chambers 104 are typically bolted to the exterior of the transfer chamber 102. Examples of process chambers 104 that may be utilized include etch chambers, physical vapor deposition chambers, chemical vapor deposition chambers, ion implantation chambers, orientation chambers, lithography chambers and the like. Different process chambers 104 may be coupled to the transfer chamber 102 to provide a processing sequence necessary to form a predefined structure or feature upon the substrate surface.

The load lock chambers 106 are generally coupled between the factory interface 110 and the transfer chamber 102. The load lock chambers 106 are generally used to facilitate transfer of the substrates between the vacuum environment of the transfer chamber 102 and the substantially ambient environment of the factory interface 110 without loss of vacuum within the transfer chamber 102. Each load lock chamber 106 is selectively isolated from the transfer chamber 102 and the factory interface 110 through the use of a slit valve (not shown in FIG. 1).

The substrate transfer robot 108 is generally disposed in the interior volume 128 of the transfer chamber 102 to facilitate transfer of the substrates 112 between the various chambers circumscribing the transfer chamber 102. The robot 108 may have a frog-leg, polar or other linkage configuration.

The robot 108 may include one or more blades utilized to support the substrate during transfer. The robot 108 may have two blades, each coupled to an independently controllable motor (known as a dual blade robot) or have two blades coupled to the robot 108 through a common linkage. The linkage is generally fabricated from aluminum or other strong, light-weight material. In some embodiments, the transfer robot 108 can have a single blade 130 coupled to the robot 108 by a (polar) linkage 132. In the embodiment depicted in FIG. 1, the linkage 132 includes a first arm 148 coupled to a second arm 146 at a joint 144. A wrist 142 is coupled to the first arm 148 opposite the joint 144. The blade 130 is coupled to the wrist 142 in a manner that facilitates ease of replacement in the event that the blade 130 becomes contaminated, worn, chipped or otherwise in need of service.

Figure 2:
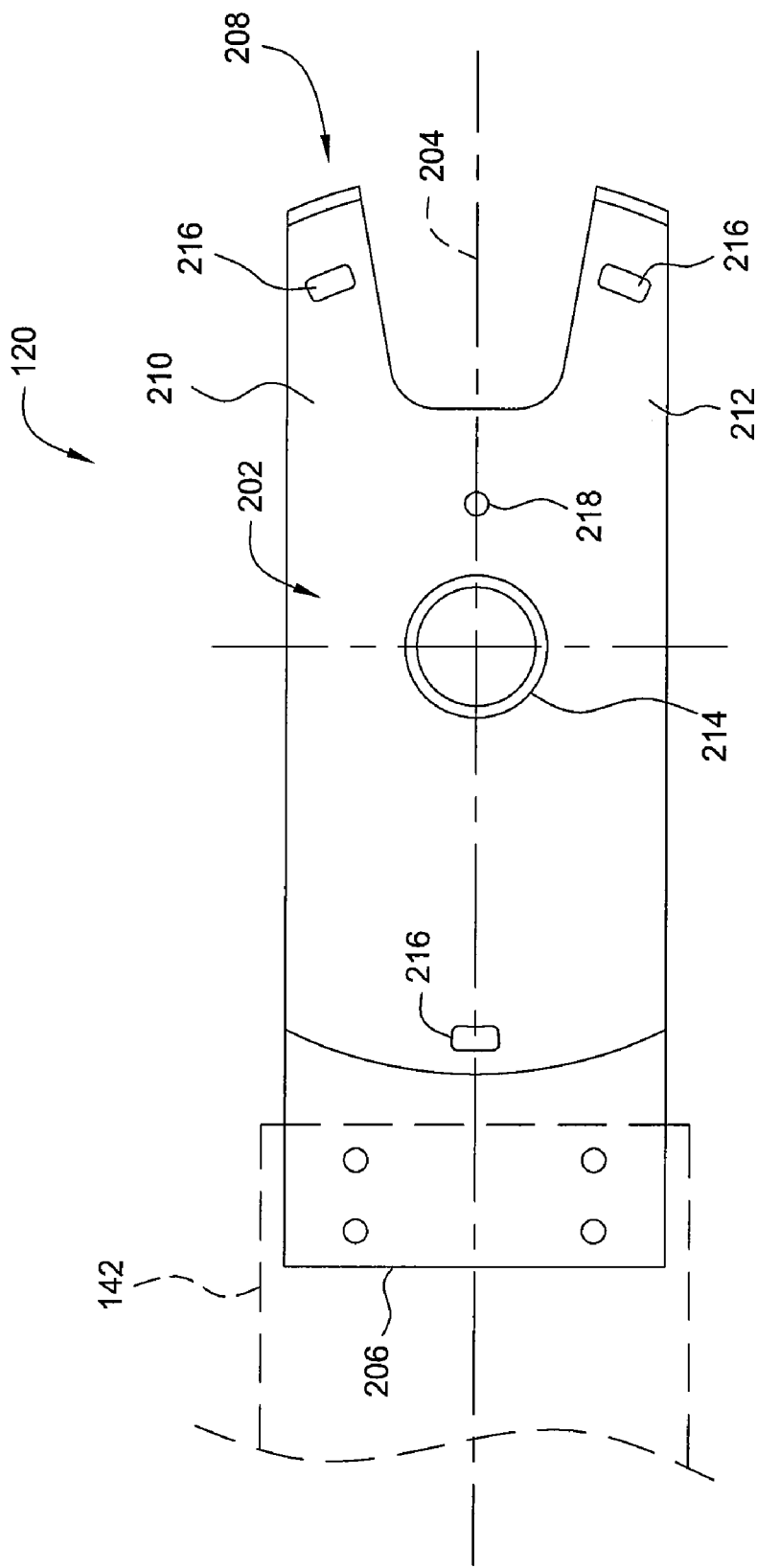
FIG. 2 is a plan view of one embodiment of the end effector of FIG. 1.

FIG. 2 depicts a plan view of the blade 130 coupled to the wrist 142 of the linkage 132 (shown in phantom). The blade 130 of FIG. 2 is configured to accommodate a 12 inch (300 mm) substrate. It is contemplated the blade 130 may be alternatively proportioned to accommodate substrates of different diameters or shapes.

The blade 130 generally includes a body 202 that is symmetrical about a centerline 204. The centerline 204 of the body 202 may also be the centerline of the wrist 142. The body 202 may be fabricated from any suitable high temperature and light-weight material, such as a ceramic. In some embodiments, the body 202 is comprised of alumina. In other embodiments, the body 202 is comprised of 99.5 percent alumina by weight. Other body materials suitable for certain applications include aluminum, stainless steel and quartz. The body 202 generally has a weight between about 237 to about 703 grams.

The body 202 has a mounting end 206 and a distal end 208. The distal end 208 may include two fingers 210, 212. The fingers 210, 212 have an outer radius of about 6.12 inches relative to a center of a hole 214 formed through the body 202. The hole 214 may be used as a view port through the body 202 or as a locator for coupling a calibration jig to the blade 130. A hole 218 formed through the body 202 along the centerline 204 may also be used for coupling a calibration jig to the blade 130.

Figure 3:
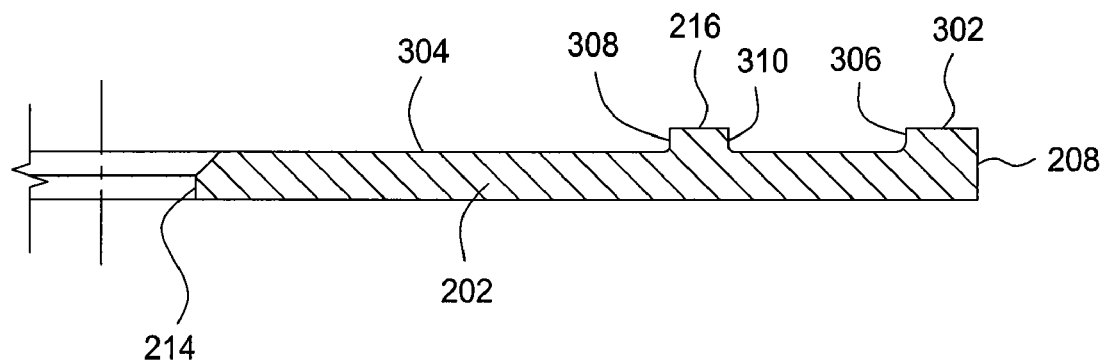
FIG. 3 is a partial sectional view of the end effector of FIG. 1.

Referring additionally to the partial sectional view of the body 202 depicted in FIG. 3, each finger 210, 212 includes a lip 302. The lip 302 generally extends about 0.125 inches above an upper surface 304 of the body 202. An inner wall 306 of the lip 302 has a radius of about 6.062 inches relative to the center of the hole 214 formed through the body 202.

The body 202 additionally includes a plurality of substrate contact pads 216. In some embodiments, three (3) contact pads 216 are utilized, with one pad 216 is disposed on the centerline 204 proximate the mounting end 206 and a respective pad 216 is disposed on each of the fingers 210, 212.

The contact pads 216 extend about 0.75 inches above the upper surface 304 of the body 202. As the contact pads 216 are integrally formed with the body 202 as a single contiguous mass of ceramic, the positional orientation of the contact pads 216 relative to the hole 214 is repeatable blade to blade, so that the substrate contact points remain unchanged, even after blade replacement. This advantageously enhances repeatability of substrate handling and transparency of blade replacement.

In the embodiment depicted in FIG. 3, the contact pads 216 have an inner wall 308 having a radius of about 5.21 inches and an outer wall 310 having a radius of about 5.55 inches relative to the center of the hole 214. The contact pads 216 may have a width of about 0.55 inches.

The contact pads 216 advantageously minimize the contact area with the substrate supported thereon. The minimized contact area reduces the heat transfer between the substrate and blade 130 thereby reducing thermal contamination of the substrate during transfer while minimizing the thermal expansion/contraction of the blade 130 due to heat transfer with the substrate, thus contributing to maintaining the positional accuracy of robot motion. Additionally, the low thermal conductivity between the ceramic pads 216 and substrate additionally limit heat transfer.

Figure 4:
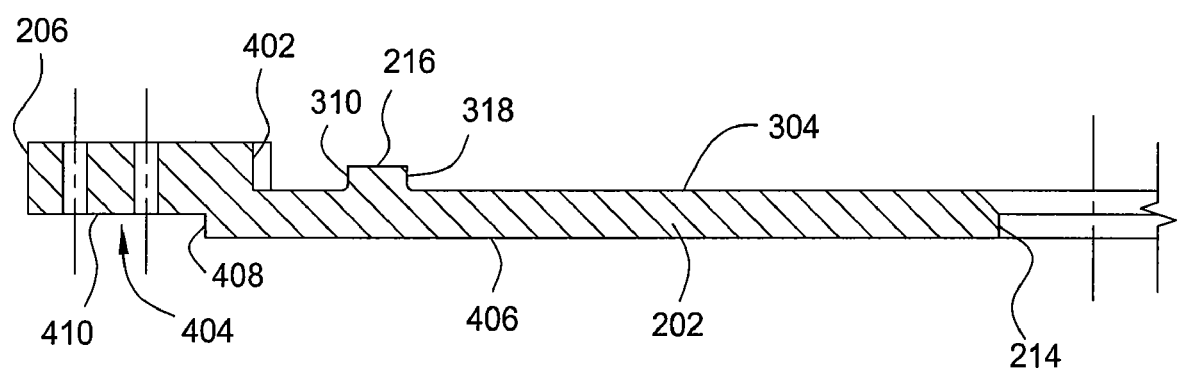
FIG. 4 is a partial sectional view of the end effector of FIG. 1.

FIG. 4 depicts a partial sectional view of the mounting end 206 of the body 202. The mounting end 206 includes an inner wall 402 formed in the upper surface 304 of the body 202 and a recess 404 formed in a lower surface 406 of the body 202. The inner wall 402 is curved and generally has a radius of about 6.062 relative to the center of the hole 214. The inner wall 402 has a height of about 0.10 inches above the upper surface 304. The inner wall 402 and the lips 302 cooperate to form a substrate receiving pocket.

The recess 404 generally includes an inner wall 408 and a bottom 410. The inner wall 408 is generally perpendicular to the centerline 204 of the body 202. The bottom 410 is generally parallel to the upper and lower surfaces 304, 406 of the body 202. The bottom 410 of the recess 404 is about 0.050 inches below the lower surface 406.

Figure 5:
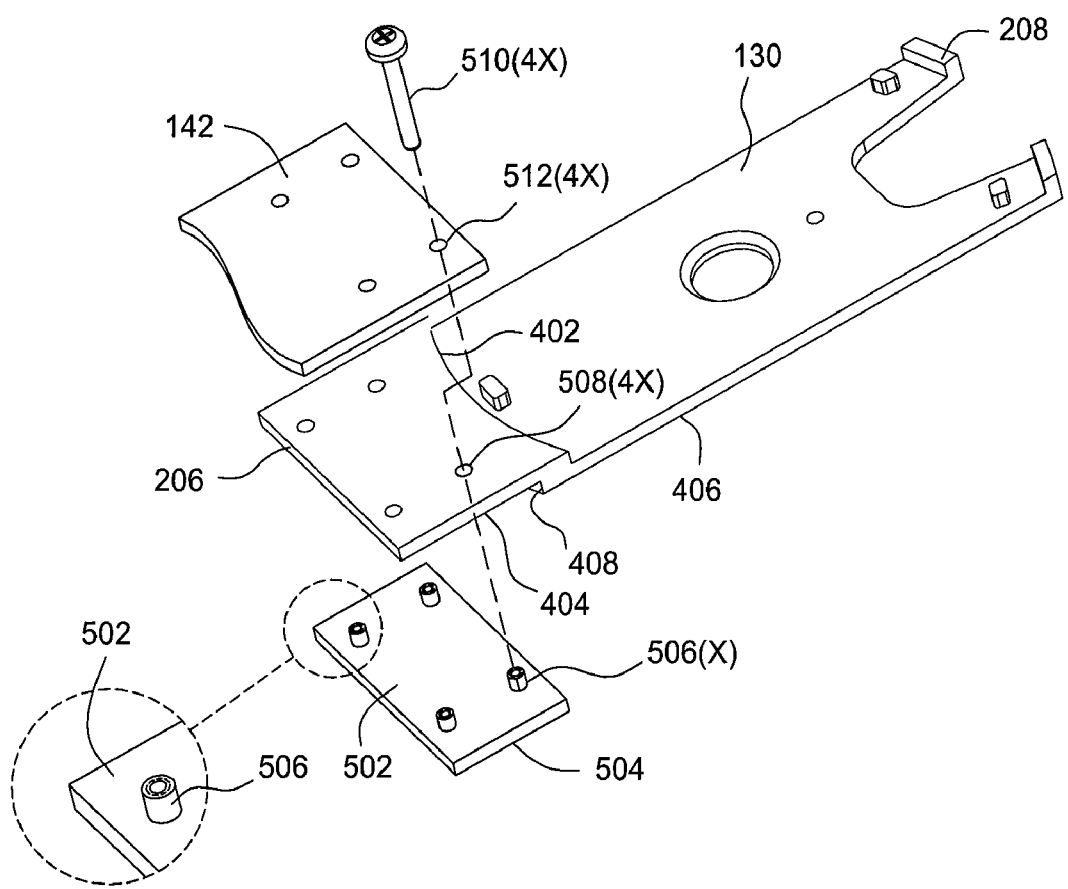
FIG. 5 is a partial exploded perspective view of the end effector and robot linkage.

Referring additionally to the exploded perspective view of FIG. 5, the recess 404 is sized to accommodate a clamp member 502 such that an outer surface 504 of the clamp member 502 is substantially flush or recess below the lower surface 406 of the body 202 when the body 202 is coupled to the wrist 142. This configuration of the clamp member 502 allows the blade 130 profile to be minimized, thereby allowing a greater range of robot motion in tight portions of the processing system and more flexibility in the design of system components due to relaxed space constraints.

The clamp member 502 generally includes four threaded bosses 506 extending therefrom. In one embodiment, the bosses 506 are arranged in a 2×2 grid pattern. The outside diameter of the bosses 506 is selective to provide a slip fit with a plurality of holes 508 formed through the body 202 of the blade 130. The holes 508 are generally formed outward of the inner wall 408 such that one end of the holes 508 is open to the recess 404. The bosses 506 have height selected to be less than the thickness of the body 130 so that when fasteners 510, extending through holes 512 formed through the wrist 142, are engaged with the bosses 506, the blade 130 is rigidly clamped to the robot linkage 132. Utilizing the bosses 506 as both an orientation feature and fastening component simplifies blade design, thereby enhancing ease of blade replacement while maintaining blade to blade orientation with the wrist.

Thus, a ceramic robot end effector has been provided that allows for greater positional repeatability of substrates in processing tools having hot processing environments. The integral contact pads and ceramic blade body minimize heat transfer between the blade and substrate, while providing blade to blade repeatability. Moreover, the ease of blade clamping facilitates rapid blade replacement without loss of blade to linkage orientation.

While the foregoing is directed to some embodiments of the present invention, other and further embodiments of the invention may be devised without departing from the basic scope thereof, and the scope thereof is determined by the claims that follow.

What is claimed is:

1. A robotic end effector suitable for transferring a substrate in a processing system, the end effector comprising:
    a body having opposing mounting and distal ends, the body fabricated from a single mass of ceramic, the body comprising:
        a pair of fingers disposed at the distal end of the body;
        a pair of arcuate lips extending upward from an upper surface of the body, each lip disposed on a respective finger;
        a plurality of contact pads extending upward from the upper surface of the body wherein the pads have an outer wall and an inner wall, the inner and outer walls of the pads being arc segments;
        an arcuate inner wall extending upward from the upper surface at the mounting end of the body, the arcuate inner wall and lips defining a substrate receiving pocket;
        a hole formed through a centerline of the body, wherein the arcuate inner wall and lips are disposed at the same radial distance from a center of the hole, wherein the inner wall of the pads has a radius of about 5.21 inches relative to the center of the hole; and
        a recess formed in a bottom surface of the body.

2. The end effector of claim 1, wherein the body further comprises:
    a plurality of mounting holes formed through the body outward of the arcuate inner wall, wherein one end of the mounting holes is open to the recess.

3. The end effector of claim 1, wherein the body weighs about 237 to about 703 grams.

4. The end effector of claim 1, wherein the body is about 99.5 percent alumina by weight.

5. The end effector of claim 1, wherein the outer wall of the pads has a radius of about 5.55 inches relative to the center of the hole.

6. A robotic end effector suitable for transferring a substrate in a processing system, the end effector comprising:
    an elongated flat body having opposing mounting and distal ends;
    a pair of fingers disposed at the distal end of the body;
    a pair of arcuate lips extending upward from an upper surface of the body, each lip disposed on a respective finger
    a plurality of contact pads extending upward from the upper surface of the body, wherein the pads have an outer wall and an inner wall, the inner and outer walls of the pads being arc segments and wherein the pads, lips and the body fabricated from a single mass of ceramic;
    an arcuate inner wall extending upward from the upper surface at the mounting end of the body, the arcuate inner wall and lips defining a substrate receiving pocket;
    a hole formed through a centerline of the body, wherein the arcuate inner wall and lips are disposed at the same radial distance from a center of the hole, wherein the inner wall of the pads has a radius of about 5.21 inches and the outer wall of the pads has a radius of about 5.55 inches relative to the center of the hole;
    a recess formed in a bottom surface of the body at the mounting end outward of the arcuate inner wall, the recess having a wall extending laterally substantially perpendicular to a centerline of the body; and a plurality of mounting holes formed through the mounting end of the body, wherein one end of the holes is open to the recess.

7. The end effector of claim 6, wherein the body weighs about 237 to about 703 grams.

8. The end effector of claim 6, wherein the body is about 99.5 percent alumina by weight.

9. The end effector of claim 6, wherein the pads extend about 0.75 inches above the body.

10. A robot suitable for transferring a substrate in a vacuum processing system, the robot comprising:
   a base;
   a linkage coupled at a first end to the base;
   a wrist coupled to a second end of the linkage; and
   an elongated flat end effector, the end effector further comprising:
      a body having a distal end and a mounting end;
      a pair of fingers disposed at the distal end of the body;
      a pair of arcuate lips extending upward from an upper surface of the body, each lip disposed on a respective finger;
      a plurality of contact pads extending upward from the upper surface of the body, wherein the pads have an outer wall and an inner wall, the inner and outer walls of the pads being arc segments and wherein the pads, lips and the body fabricated from a single mass of ceramic;
      an arcuate inner wall extending upward from the upper surface at the mounting end of the body, the arcuate inner wall and lips defining a substrate receiving pocket;
      a hole formed through a centerline of the body, wherein the arcuate inner wall and lips are disposed at the same radial distance from a center of the hole, wherein the outer wall of the pads has a radius of about 5.55 inches relative to the center of the hole;
      a recess formed in a bottom surface of the body at the mounting end outward of the arcuate inner wall, the recess having a wall extending laterally substantially perpendicular to a centerline of the body; and
      a plurality of mounting holes formed through the mounting end of the body, wherein one end of the mounting holes is open to the recess.

11. A robot suitable for transferring a substrate in a vacuum processing system, the robot comprising:
   a base;
   a linkage coupled at a first end to the base;
   a wrist coupled to a second end of the linkage; and an elongated flat end effector, the end effector further comprising:
      a body;
      a pair of fingers disposed at the distal end of the body;
      a pair of arcuate lips extending upward from an upper surface of the body, each lip disposed on a respective finger;
      a plurality of contact pads extending upward from the upper surface of the body, the pads, lips and the body fabricated from a single mass of ceramic;
      an arcuate inner wall extending upward from the upper surface at the mounting end of the body, the inner wall and lips defining a substrate receiving pocket;
      a hole formed through a centerline of the body, wherein the inner wall and lips are disposed at the same radial distance from a center of the hole;
      a recess formed in a bottom surface of the body at the mounting end outward of the inner wall, the recess having a wall extending laterally substantially perpendicular to a centerline of the body; and
      a plurality of mounting holes formed through the mounting end of the body, wherein one end of the mounting holes is open to the recess;
      a clamp plate having a plurality of bosses extending therefrom, the bosses extending into the mounting holes of the end effector; and
      a plurality of fasteners coupling the clamp plate to the wrist.

12. The robot of claim 11, wherein the clamp plate is disposed in the recess of the end effector.

* * * * *